(12) United States Patent
Jang et al.

(10) Patent No.: US 7,522,007 B2
(45) Date of Patent: Apr. 21, 2009

(54) INJECTION LOCKED FREQUENCY DIVIDER

(75) Inventors: Sheng-Lyang Jang, Taipei (TW);
Yun-Hsueh Chuang, Taoyuan (TW);
Shao-Hwa Lee, Taipei (TW)

(73) Assignee: National Taiwan University of Science & Technology, Taipei (TW)

( * ) Notice: Subject to any disclaimer, the term of this patent is extended or adjusted under 35 U.S.C. 154(b) by 87 days.

(21) Appl. No.: 11/892,194

(22) Filed: Aug. 21, 2007

(65) Prior Publication Data

US 2008/0197894 A1 Aug. 21, 2008

(30) Foreign Application Priority Data

Feb. 15, 2007 (TW) .............................. 96105814 A

(51) Int. Cl.
*H03B 5/12* (2006.01)
(52) U.S. Cl. .................. 331/172; 331/117 FE; 327/118
(58) Field of Classification Search ............. 331/117 R, 331/117 FE, 117 D, 172–174; 327/115, 117–118
See application file for complete search history.

(56) References Cited

U.S. PATENT DOCUMENTS 7,446,617 B2 * 11/2008 Jang et al. ..................... 331/55

OTHER PUBLICATIONS

Chuang, Y.H.,et al.; A Ring-Oscillator-Based Wide Locking Range Frequency Divider; IEEE Microwave and Wireless Components Letters; Aug. 2006; 470-472; vol. 16, No. 8.
Tiebout, Marc; A CMOS Direct Injection-Locked Oscillator Topology as High-Frequency Low-Power Frequency Divider; IEEE Journal of Solid-State Circuits; Jul. 2004; 1170-1174; vol. 39, No. 7.

* cited by examiner

*Primary Examiner*—David Mis
(74) *Attorney, Agent, or Firm*—Bacon & Thomas, PLLC

(57) ABSTRACT

An injection locked frequency divider includes a signal injection unit, a Hartley voltage controlled oscillator and a biasing unit. The signal injection unit and the biasing unit output an injection signal to the Hartley voltage controlled oscillator to bias the Hartley voltage controlled oscillator. The Hartley voltage controlled oscillator, which includes a first transistor, a second transistor and a LC tank, receives the injection signal and outputs a differential output signal through a first output terminal and a second output terminal. First terminals of the first and second transistors are respectively coupled to the first and second output terminals, and second terminals of the first and second transistors are coupled to a first node. The LC tank decides a resonant frequency of the Hartley voltage controlled oscillator and serves as a positive feedback circuit for the first and second transistors.

12 Claims, 4 Drawing Sheets

INJECTION LOCKED FREQUENCY DIVIDER

This application claims the benefit of Taiwan application Serial No. 096105814, filed Feb. 15, 2007, the subject matter of which is incorporated herein by reference.

BACKGROUND OF THE INVENTION

1. Field of the Invention

The invention relates in general to an injection locked frequency divider, and more particularly to an injection locked frequency divider using a Hartley voltage controlled oscillator or a Colpitts voltage controlled oscillator.

2. Description of the Related Art

With the development of the communication industry, a high-frequency phase lock loop (PLL) has been widely used in various wired and wireless communication systems, such as a frequency synthesizer or a clock generator. In the high-frequency PLL, a high-frequency frequency divider, which is one of the indispensable elements, receives an original signal and divides the frequency of the original signal by one value or multiple values to lower the frequency thereof.

At present, an injection locked frequency divider having a signal injection unit and a voltage controlled oscillator, such as a LC tank oscillator, is frequently adopted to divide the frequency of the injection signal received by the signal injection unit. In the present technology, only the injection locked frequency divider using the cross-coupled LC tank oscillator is provided. However, it is an important subject in the industry to design an injection locked frequency divider circuit, which can use other types of voltage controlled oscillators and can be thus flexibly applied to various occasions.

SUMMARY OF THE INVENTION

The invention is directed to an injection locked frequency divider capable of effectively improving the problem that the conventional injection locked frequency divider only can use the cross-coupled LC tank oscillator. Thus, the injection locked frequency divider of the invention can effectively adopt a Hartley or Colpitts voltage controlled oscillator and thus substantially has the flexibility of enhancing the circuit design of the injection locked frequency divider and the advantage of enhancing the application range thereof.

According to a first aspect of the present invention, an injection locked frequency divider including a signal injection unit, a Hartley voltage controlled oscillator and a biasing unit is provided. The signal injection unit and the biasing unit respectively output an injection signal and first and second currents to the Hartley voltage controlled oscillator. The Hartley voltage controlled oscillator receives the injection signal and outputs a differential output signal through a first output terminal and a second output terminal. The Hartley voltage controlled oscillator includes a first transistor, a second transistor and a LC tank. First terminals of the first transistor and the second transistor are respectively coupled to the first and second output terminals. Second terminals of the first transistor and the second transistor are coupled to a first node. The LC tank includes multiple inductor units and multiple capacitor units to decide a resonant frequency of the Hartley voltage controlled oscillator. The LC tank is coupled to and between the first output terminal and a control terminal of the first transistor, and coupled to and between the second output terminal and a control terminal of the second transistor to serve as a positive feedback circuit for the first and second transistors.

According to a second aspect of the present invention, an injection locked frequency divider including a signal injection unit and a Colpitts voltage controlled oscillator is provided. The signal injection unit outputs an injection signal to the Colpitts voltage controlled oscillator. The Colpitts voltage controlled oscillator receives the injection signal and outputs a differential output signal through a first output terminal and a second output terminal. The Colpitts voltage controlled oscillator includes a first transistor, a second transistor, a cross-coupled transistor pair and a LC tank. First terminals of the first and second transistors are respectively coupled to the first and second output terminals. Second terminals of the first and second transistors are coupled to a first node. The cross-coupled transistor pair includes a third transistor and a fourth transistor. First terminals of the third and fourth transistors receive a first voltage signal, second terminals of the third and fourth transistors are respectively coupled to the first terminals of the first and second transistors, and control terminals of the third and fourth transistors are respectively coupled to the second terminals of the fourth and third transistors. The LC tank includes multiple inductor units and multiple capacitor units to decide a resonant frequency of the Colpitts voltage controlled oscillator. The LC tank is coupled to and between the first output terminal and a control terminal of the first transistor, and coupled to and between the second output terminal and a control terminal of the second transistor to serve as a positive feedback circuit for the first and second transistors. The capacitor unit includes oxide layer capacitors of the third and fourth transistors.

The invention will become apparent from the following detailed description of the preferred but non-limiting embodiments. The following description is made with reference to the accompanying drawings.

DETAILED DESCRIPTION OF THE INVENTION

The injection locked frequency divider of this embodiment is implemented as including a signal injection unit and a Hartley voltage controlled oscillator or a Colpitts voltage controlled oscillator.

First Embodiment

Figure 1:
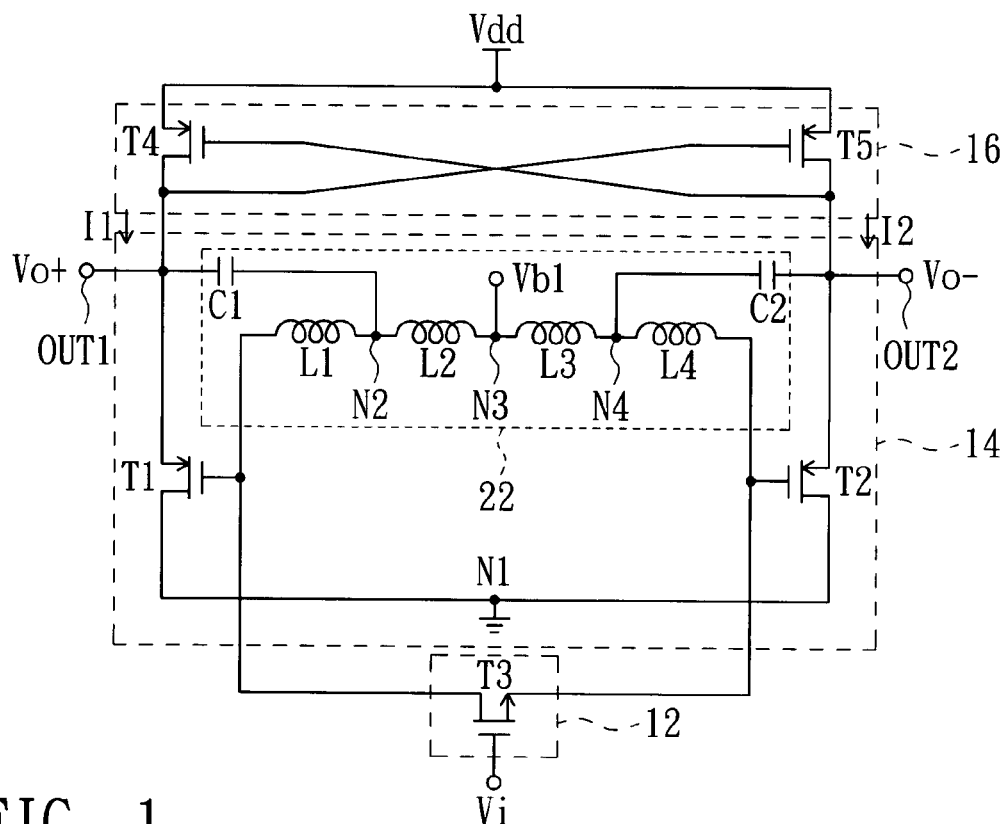
FIG. 1 is a circuit diagram showing an injection locked frequency divider according to a first embodiment of the invention.

FIG. 1 is a circuit diagram showing an injection locked frequency divider 10 according to a first embodiment of the invention. Referring to FIG. 1, the injection locked frequency divider 10 includes a signal injection unit 12, a Hartley voltage controlled oscillator 14 and a biasing unit 16. The signal injection unit 12 and the biasing unit 16 respectively receive and output an injection signal Vi to the Hartley voltage controlled oscillator 14, and provides currents I1 and I2 to the Hartley voltage controlled oscillator 14.

The Hartley voltage controlled oscillator 14 receives the injection signal Vi and outputs signals Vo+ and Vo−, such as a positive end and a negative end of a differential signal Vo, through output terminals OUT1 and OUT2. The Hartley voltage controlled oscillator 14 includes transistors T1 and T2 and a LC tank 22.

In this illustrated embodiment, the transistors T1 and T2 are PMOS transistors. Sources of the transistors T1 and T2 are respectively coupled to the output terminals OUT1 and OUT2, drains of the transistors T1 and T2 are coupled to a node N1, and gates of the transistors T1 and T2 are respectively coupled to the LC tank 22. In this embodiment, the voltage level of the node N1 is equal to a ground level.

The LC tank 22 includes capacitors C1 and C2 and inductors L1, L2, L3 and L4. The inductors L1 to L4 are sequentially and serially connected to and between the gates of the transistors T1 and T2, while connection points between the inductors L1 and L2, L2 and L3 and L3 and L4 respectively form nodes N2, N3 and N4. The capacitors C1 and C2 are respectively coupled to and between the output terminal OUT1 and the node N2, and coupled to and between the output terminal OUT2 and the node N4. The LC tank 22 serves as a positive feedback circuit for the transistors T1 and T2 and decides a resonant frequency of the Hartley voltage controlled oscillator 14 of this embodiment. The node N3 receives a voltage signal Vb0 to bias the transistors T1 and T2.

When the injection signal Vi is injected into the Hartley voltage controlled oscillator 14 through the signal injection unit 12, the frequency of the injection signal Vi and the resonant frequency of the Hartley voltage controlled oscillator 14 are mixed together. When the frequency of the injection signal Vi approaches a double of the oscillation frequency of the Hartley voltage controlled oscillator 14, the frequency of the differential signal Vo outputted from the output terminals OUT1 and OUT2 approximates the resonant frequency of the Hartley voltage controlled oscillator 14. Thus, the injection locked frequency divider 10 of this embodiment can effectively divide the frequency of the injection signal Vi to generate the differential signal Vo having the frequency substantially equal to one half of the frequency of the injection signal Vi.

The signal injection unit 12, such as a direct injecting type injection unit, includes a transistor T3 such as a NMOS transistor. The transistor T3 has a drain and a source respectively coupled to the gates of the transistors T1 and T2, and a gate for receiving the injection signal Vi. The transistor T3 responds with the injection signal Vi to switch on and off so that the gates of the transistors T1 and T2 are switched on and off according to the frequency of the injection signal Vi, and the oscillation frequency of the LC tank 22 is influenced by and mixed with the frequency of an injection signal Si.

The biasing unit 16, such as a cross-coupled transistor pair, includes cross-coupled transistors T4 and T5. The transistors T4 and T5, such as PMOS transistors, have sources for receiving a voltage signal Vdd, drains respectively coupled to the output terminals OUT1 and OUT2, and gates respectively coupled to the output terminals OUT2 and OUT1. The voltage signal Vdd may be, for example, the signal of the injection locked frequency divider 10 having the highest level in this embodiment. In this embodiment, the biasing unit 16 can provide the currents I1 and I2 to bias the Hartley voltage controlled oscillator 14 and can further provide an equivalent negative resistor to offset the circuit loss in the LC tank 22, and to cross-couple the signals at the output terminals OUT1 and OUT2 so that the Hartley voltage controlled oscillator 14 has substantially the ideal resonant and differential output operations.

The inductors L1 to L4 of this embodiment are implemented by one tapped inductor or multiple tapped inductors. For example, the inductors L1 to L4 of this embodiment are implemented by first and second tapped inductors. The first tapped inductor has three tapped points to form the inductors L1 and L4, and the second tapped inductor also has three tapped points to form the inductors L2 and L3. Thus, using the tapped inductor or inductors to implement the inductors L1 to L4 can effectively reduce the circuit area of the injection locked frequency divider 10 in this embodiment and lower the cost of the injection locked frequency divider 10.

Figure 2:
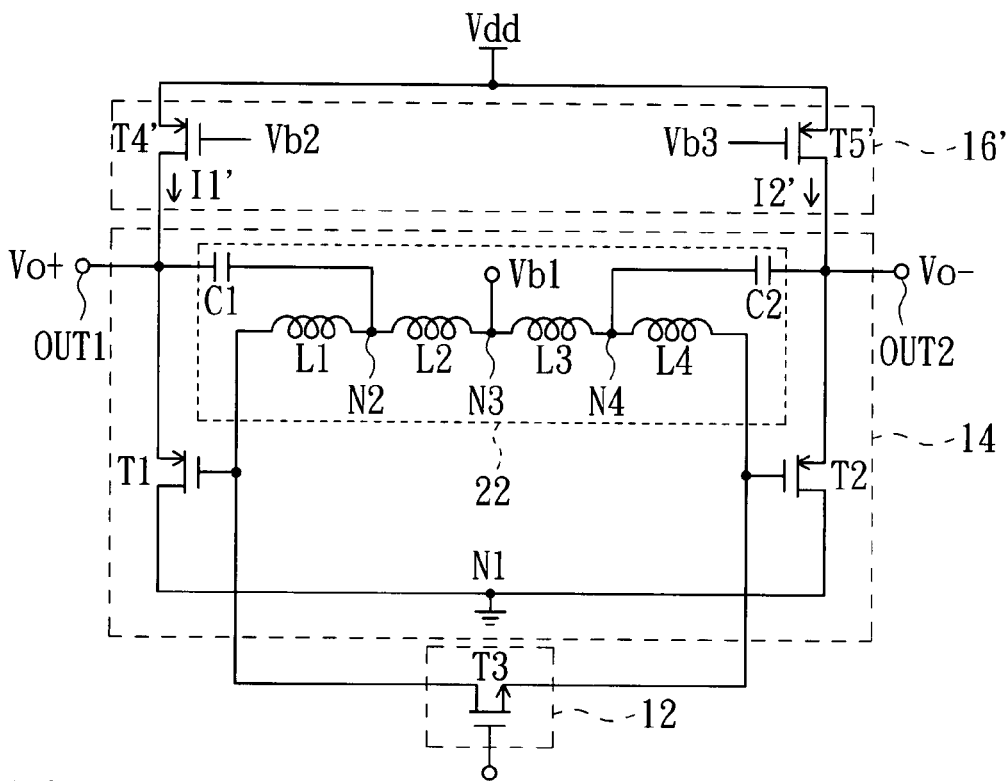
FIG. 2 is another circuit diagram showing the injection locked frequency divider according to the first embodiment of the invention.

In this illustrated embodiment, the injection locked frequency divider 10 includes the biasing unit 16 to serve as the bias current source of the injection locked frequency divider 10. However, the biasing unit 16 of the injection locked frequency divider 10 is not restricted to the cross-coupled transistor pair and may be one of the biasing units with other forms. FIG. 2 is another circuit diagram showing the injection locked frequency divider according to the first embodiment of the invention. As shown in FIG. 2, the biasing unit 16 of FIG. 1 is replaced by the biasing unit 16' in the injection locked frequency divider 10'. The biasing unit 16' includes transistors T4' and T5' having gates for respectively receiving the voltage signals Vb1 and Vb2. The transistors T4' and T5' may be PMOS transistors, for example. The voltage signals Vb1 and Vb2 bias the transistors T4' and T5' to the saturation regions to provide the constant currents I1' and I2' to the transistors T1 and T2.

Figure 3:
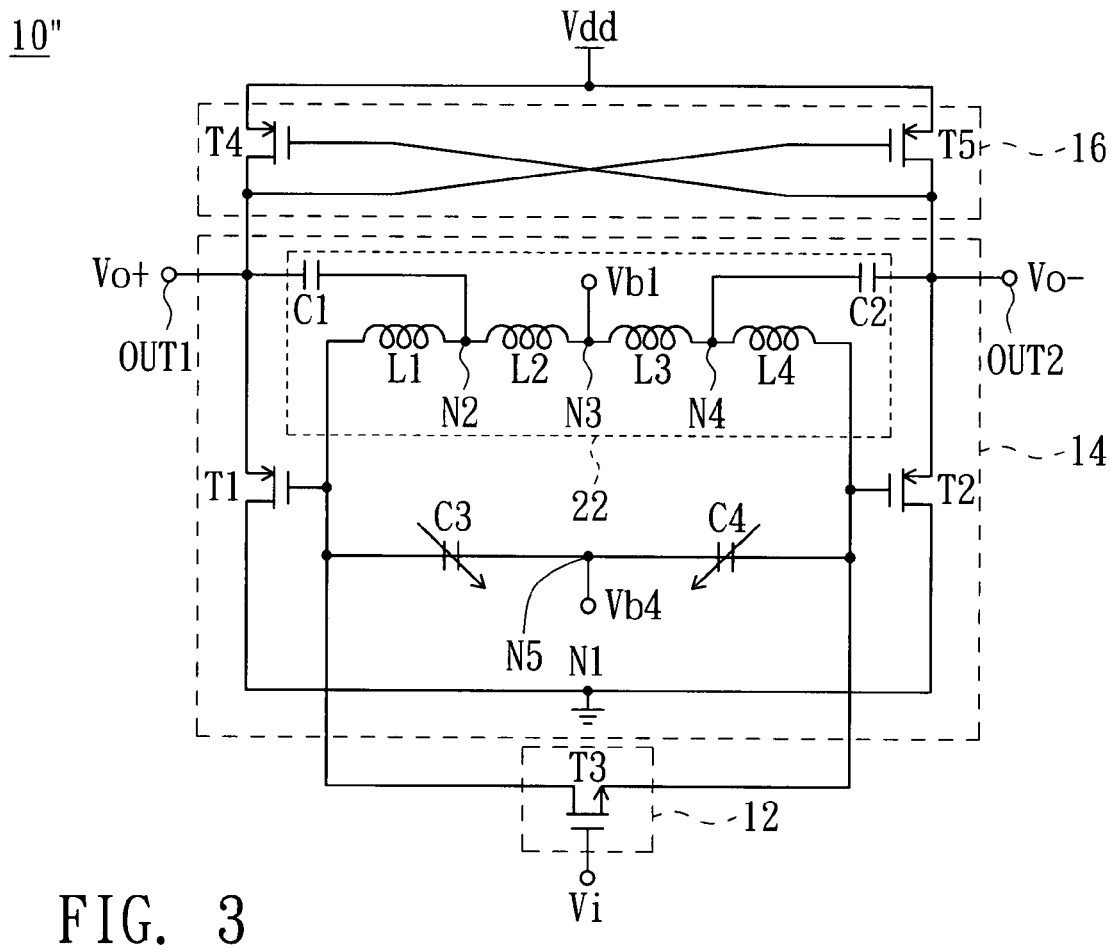
FIG. 3 is still another circuit diagram showing the injection locked frequency divider according to the first embodiment of the invention.

In this illustrated embodiment, the Hartley voltage controlled oscillator 14 has the circuit structure of the LC tank 22. However, the Hartley voltage controlled oscillator 14 of the injection locked frequency divider 10 is not restricted to the circuit structure of this embodiment, and may have any other similar circuit structure. For example, the Hartley voltage controlled oscillator 14 of this embodiment may further have varactors C3 and C4 having first terminals coupled to each other to form a node N5, and second terminals respectively coupled to the gates of the transistors T1 and T2. FIG. 3 is still another circuit diagram showing the injection locked frequency divider according to the first embodiment of the invention. As shown in FIG. 3, the voltage level of the node N5 equal to the voltage signal Vb4, for example, controls the voltages across two terminals of each of the varactors C3 and C4 to control the capacitance thereof. Thus, the resonant frequency of the Hartley voltage controlled oscillator 14 is changed and the injection locked range of the injection locked frequency divider 10 of this embodiment is enhanced.

Figure 4:
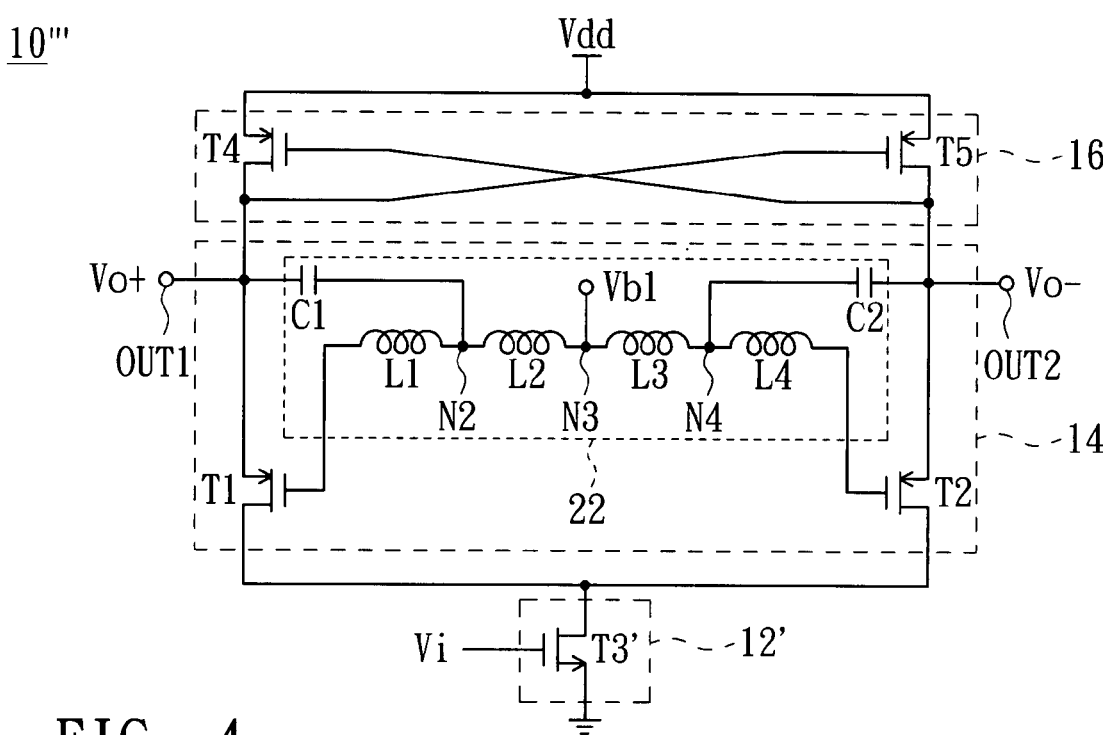
FIG. 4 is yet still another circuit diagram showing the injection locked frequency divider according to the first embodiment of the invention.

In the illustrated embodiment, the signal injection unit 12 serves as the direct injecting type injection unit. However, the signal injection unit 12 of this embodiment is not restricted to the direct injecting type injection unit, but may be one of the signal injection units with other forms. FIG. 4 is yet still another circuit diagram showing the injection locked frequency divider according to the first embodiment of the invention. As shown in FIG. 4, the signal injection unit 12 of FIG. 1 is replaced by a current source type injection unit 12'. The current source type injection unit 12' includes, for example, an NMOS transistor T3' having a drain and a source respectively coupled to the node N1 and receiving the ground level, and a gate for receiving the injection signal Vi.

In this illustrated embodiment, the injection locked frequency divider 10 has the main architecture of the Hartley voltage controlled oscillator 14 having two differential outputs at two terminals. However, the injection locked frequency divider 10 is not restricted to the Hartley voltage controlled oscillator 14 having two differential outputs at two terminals, but may have the main architecture of the Hartley voltage controlled oscillator having the single-end output or any other form.

The injection locked frequency divider of this embodiment has the Hartley voltage controlled oscillator and the signal injection unit, receives the injection signal through the signal injection unit, and mixes the frequency of the injection signal with the oscillation frequency of the Hartley voltage controlled oscillator to output the differential signal having the frequency substantially equal to one half of the frequency of the injection signal. Consequently, the injection locked frequency divider of this embodiment can effectively improve the problem that the conventional injection locked frequency divider only can use the cross-coupled LC tank oscillator, and can also effectively provide the flexibility of the circuit design of the injection locked frequency divider using the Hartley voltage controlled oscillator.

In addition, the injection locked frequency divider of this embodiment may be configured to have the single-end output using the Hartley voltage controlled oscillator with the single-end output as the main architecture. Consequently, the injection locked frequency divider of this embodiment further has the advantage of being applied to the application circuit environment for receiving the single-end output signal, and the advantage of the wider application range.

Second Embodiment

Figure 5:
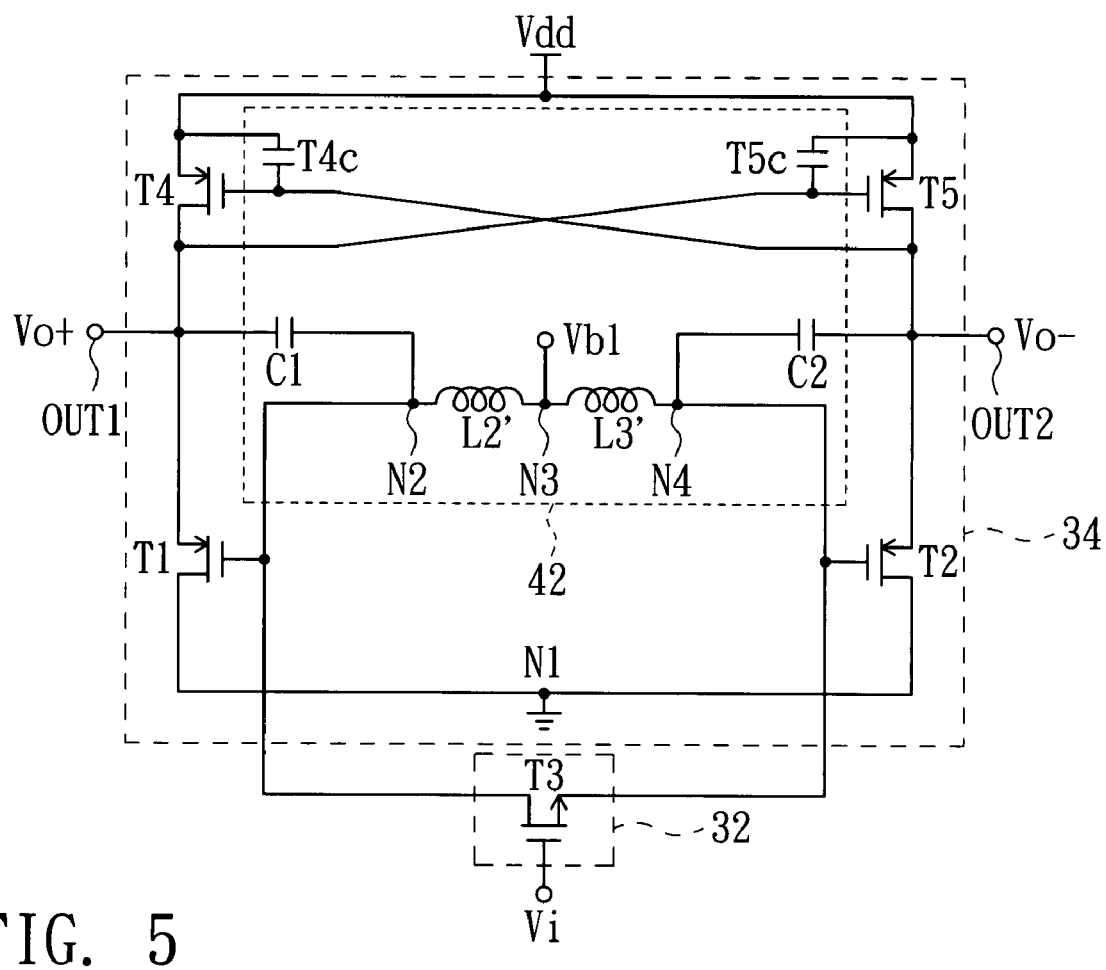
FIG. 5 is a circuit diagram showing an injection locked frequency divider according to a second embodiment of the invention.

FIG. 5 is a circuit diagram showing an injection locked frequency divider 30 according to a second embodiment of the invention. As shown in FIG. 5, the injection locked frequency divider 30 of this embodiment differs from the injection locked frequency divider 10 of the first embodiment in that the Hartley voltage controlled oscillator 14 and the biasing unit 16 are replaced by a voltage controlled oscillator 34 in the injection locked frequency divider 30 of this embodiment, and the differential signal Vo, which has the frequency substantially equal to one half of the frequency of the injection signal Vi, is generated after a signal injection unit 32 has injected the injection signal Vi. The voltage controlled oscillator 34 may be the Colpitts voltage controlled oscillator, for example.

In this embodiment, the inductors L2' and L3' are respectively implemented by the first and second tapped inductors, for example. The circuit of the injection locked frequency divider 30 of this embodiment is substantially the same as that of the injection locked frequency divider of FIG. 1 except that the positions of the tapped points of the tapped inductors are different so that the equivalent inductance between the transistor T1 and the node N2 and the equivalent inductance between the gate of the transistor T2 and the node N4 are substantially equal to 0. Consequently, a LC tank 42 including the inductors L2' and L3', the capacitors C1 and C2 and gate oxide layer capacitors T4c and T5c of the transistors T4 and T5 are substantially equal to the LC tank of the Colpitts voltage controlled oscillator. Therefore, the injection locked frequency divider 30 of this embodiment is substantially an injection locked frequency divider using the Colpitts voltage controlled oscillator.

Figure 6:
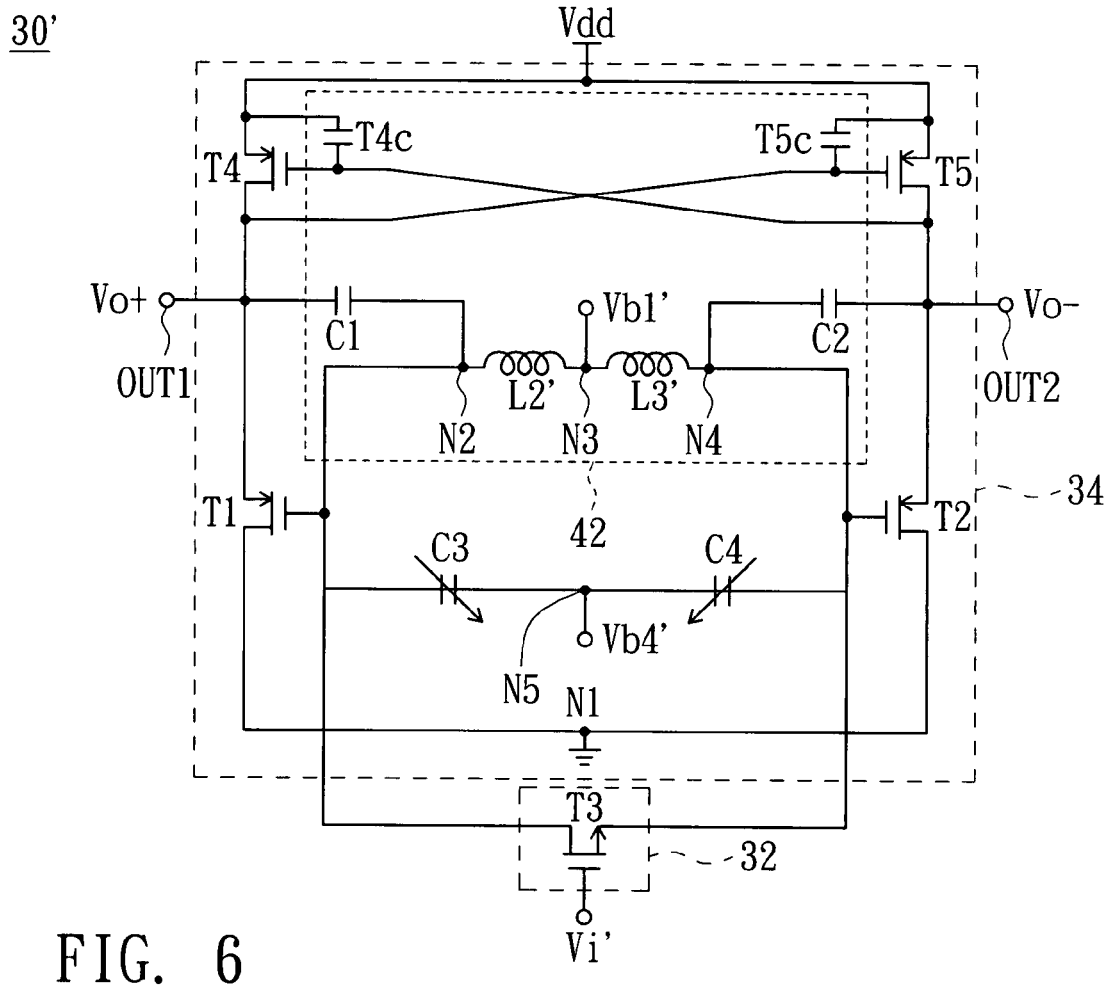
FIG. 6 is another circuit diagram showing the injection locked frequency divider according to the second embodiment of the invention.
Figure 7:
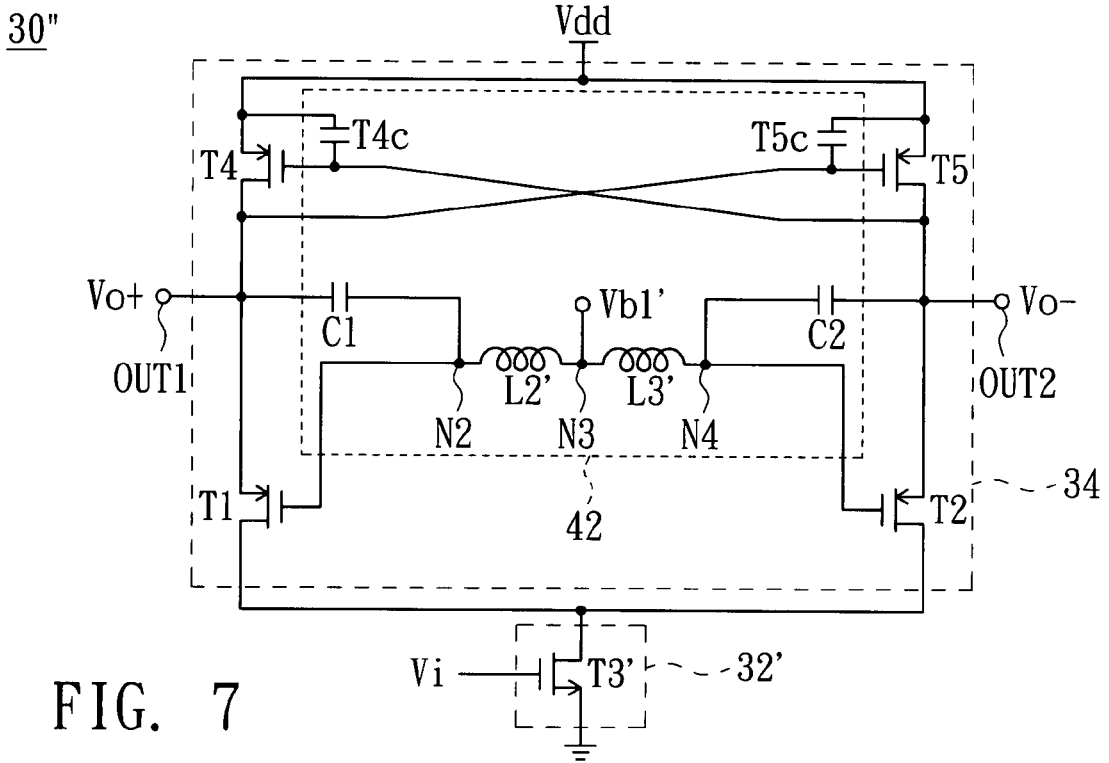
FIG. 7 is still another circuit diagram showing the injection locked frequency divider according to the second embodiment of the invention.

Like the injection locked frequency divider 10 of the first embodiment, the injection locked frequency divider 30 of this embodiment may also have several implementation circuits, as shown in FIGS. 6 and 7, in the aspect whether the varactors C3 and C4 are provided and in the aspect of the type of the signal injection unit 12. The associated operations and functions of the injection locked frequency dividers 30' and 30" in FIGS. 6 and 7 may also be analogized according to the descriptions relating to those of FIGS. 3 and 4 in the first embodiment.

Consequently, the injection locked frequency divider of this embodiment can also effectively improve the problem that the conventional injection locked frequency divider only can use the cross-coupled LC tank oscillator as the main architecture and only has the dual-end output circuit aspect, and thus can effectively provide the flexibility of the circuit design of the injection locked frequency divider using the Colpitts voltage controlled oscillator as the main structure of the injection locked frequency divider. In addition, the injection locked frequency divider with the single-end may be designed using the Hartley voltage controlled oscillator with the single-end output as the main architecture so that the injection locked frequency divider can be advantageously applied to the application circuit environment for receiving the single-end output signal and advantageously has the wider application range.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An injection locked frequency divider, comprising:
a signal injection unit for receiving and outputting an injection signal;
a Hartley voltage controlled oscillator for receiving the injection signal and outputting a differential output signal, which has a frequency equal to a divided frequency, through a first output terminal and a second output terminal, the Hartley voltage controlled oscillator comprising:
a first transistor and a second transistor, wherein first terminals of the first and second transistors are respectively coupled to the first and second output terminals, and second terminals of the first and second transistors are coupled to a first node; and
a LC tank coupled to and between the first output terminal and a control terminal of the first transistor, and coupled to and between the second output terminal and a control terminal of the second transistor to serve as a positive feedback circuit for the first and second transistors, wherein the LC tank decides a resonant frequency of the Hartley voltage controlled oscillator, and a frequency of the injection signal and the resonant frequency are mixed together to generate a frequency equal to the divided frequency of the differential output signal; and
a biasing unit for supplying a first current and a second current to the Hartley voltage controlled oscillator to bias the Hartley voltage controlled oscillator.

2. The divider according to claim 1, wherein the signal injection unit is a direct injecting type injection unit, which comprises a fourth transistor having a first terminal and a second terminal respectively coupled to the control terminals of the first and second transistors, and a control terminal for receiving the injection signal.

3. The divider according to claim 1, wherein the signal injection unit is a current source injecting type injection unit, which comprises a third transistor having a first terminal coupled to the first node, a second terminal for receiving a first voltage signal and a control terminal for receiving the injection signal.

4. The divider according to claim 1, wherein the biasing unit comprises:
   a fifth transistor and a sixth transistor, wherein first terminals of the fifth and sixth transistors receive a second voltage signal, second terminals of the fifth and sixth transistors are respectively coupled to the first and second output terminals, and control terminals of the fifth and sixth transistors respectively receive a first bias signal and a second bias signal, the first and second bias signals respectively bias the fifth and sixth transistors to operate in active regions to respectively provide the first and second currents.

5. The divider according to claim 1, wherein the biasing unit comprises:
   a cross-coupled transistor pair comprising a seventh transistor and an eighth transistor, wherein first terminals of the seventh and eighth transistors receive a second voltage signal, second terminals of the seventh and eighth transistors are respectively coupled to the first and second output terminals, and control terminals of the seventh and eighth transistors are respectively coupled to the second and first output terminals.

6. The divider according to claim 1, wherein the LC tank comprises a first inductor unit, a second inductor unit, a third inductor unit, a fourth inductor unit, a first capacitor unit and a second capacitor unit, the first to fourth inductor units are sequentially and serially connected to the control terminals of the first and second transistors, a first terminal and a second terminal of the first capacitor unit are respectively coupled to the first output terminal and a connection point between the first and second inductor units, and a first terminal and a second terminal of the second capacitor unit are respectively coupled to the second output terminal and a connection point between the third and fourth inductor units.

7. The divider according to claim 6, wherein the Hartley voltage controlled oscillator comprises:
   a first varactor and a second varactor, wherein first terminals of the first and second varactors are respectively coupled to the control terminals of the first and second transistors, second terminals of the first and second varactors are coupled to each other and receive a third bias signal, the first and second varactors respond with the third bias signal to change capacitances thereof and thus to change the resonant frequency of the Hartley voltage controlled oscillator.

8. An injection locked frequency divider, comprises:
   a signal injection unit for receiving an injection signal; and
   a Colpitts voltage controlled oscillator for receiving the injection signal and outputting a differential output signal, which has a frequency equal to a divided frequency, through a first output terminal and a second output terminal, the Colpitts voltage controlled oscillator comprising:
      a first transistor and a second transistor, wherein first terminals of the first and second transistors are respectively coupled to the first and second output terminals, and second terminals of the first and second transistors are coupled to a first node;
      a cross-coupled transistor pair comprising a third transistor and a fourth transistor, wherein first terminals of the third and fourth transistors receive a first voltage signal, second terminals of the third and fourth transistors are respectively coupled to the first terminals of the first and second transistors, and control terminals of the third and fourth transistors are respectively coupled to the second terminals of the fourth and third transistors; and
      a LC tank coupled to and between the first output terminal and a control terminal of the first transistor and coupled to and between the second output terminal and a control terminal of the second transistor to serve as a positive feedback circuit for the first and second transistors, wherein the LC tank decides a resonant frequency of the Colpitts voltage controlled oscillator, and a frequency of the injection signal and the resonant frequency are mixed together to generate a frequency equal to the divided frequency of the differential output signal.

9. The divider according to claim 8, wherein the signal injection unit is a direct injecting type injection unit, which comprises a fifth transistor having a first terminal and a second terminal respectively coupled to the control terminals of the first and second transistors, and a control terminal for receiving the injection signal.

10. The divider according to claim 8, wherein the signal injection unit is a current source injecting type injection unit, which comprises a sixth transistor having a first terminal coupled to the first node, a second terminal for receiving the first voltage signal, and a control terminal for receiving the injection signal.

11. The divider according to claim 8, wherein the LC tank further comprises a first inductor unit, a second inductor unit, a first capacitor unit, a second capacitor unit, and oxide layer capacitors of the third and fourth transistors, the first and second inductor units are sequentially and serially connected to the control terminals of the first and second transistors, a first terminal and a second terminal of the first capacitor unit are respectively coupled to the control terminals of the first output terminal and the first transistor, a first terminal and a second terminal of the second capacitor unit are respectively coupled to the control terminals of the second output terminal and the second transistor, and the first terminals of the first and second capacitor units are further respectively coupled to the oxide layer capacitors of the third and fourth transistors.

12. The divider according to claim 8, wherein the Colpitts voltage controlled oscillator further comprises:
   a first varactor and a second varactor, wherein first terminals of the first and second varactors are respectively coupled to the control terminals of the first and second transistors, second terminals of the first and second varactors are coupled to each other to receive a second bias signal, and the first and second varactors respond with the second bias signal to change capacitances thereof and thus to change the resonant frequency of the Colpitts voltage controlled oscillator.

* * * * *